US008243442B2

(12) United States Patent
Hobson et al.

(10) Patent No.: US 8,243,442 B2
(45) Date of Patent: Aug. 14, 2012

(54) INTEGRATED BUTTON ASSEMBLY

(75) Inventors: Phillip M. Hobson, Menlo Park, CA (US); Stephen Brian Lynch, Portola Valley, CA (US)

(73) Assignee: Apple Inc., Cupertino, CA (US)

( * ) Notice: Subject to any disclaimer, the term of this patent is extended or adjusted under 35 U.S.C. 154(b) by 201 days.

(21) Appl. No.: 12/794,603

(22) Filed: Jun. 4, 2010

(65) Prior Publication Data

US 2011/0242747 A1 Oct. 6, 2011

Related U.S. Application Data

(60) Provisional application No. 61/319,790, filed on Mar. 31, 2010.

(51) Int. Cl.
*G06F 1/16* (2006.01)
*H05K 7/00* (2006.01)
*H01H 13/14* (2006.01)

(52) U.S. Cl. ........... 361/679.56; 361/679.02; 200/302.2; 200/341; 200/406; 200/516

(58) Field of Classification Search ............. 361/679.02, 361/679.55–679.56; 200/302.1–302.2, 341, 200/406, 516
See application file for complete search history.

(56) References Cited

U.S. PATENT DOCUMENTS 4,778,952 A * 10/1988 Watkins et al. ............... 200/5 A
4,803,321 A * 2/1989 Lefebvre ........................ 200/517
7,109,431 B2 * 9/2006 Yanai et al. ................... 200/512
7,151,236 B2 * 12/2006 Ducruet et al. ............... 200/406
7,906,739 B2 * 3/2011 Villain et al. ................. 200/292
7,982,151 B2 * 7/2011 Villain et al. ................. 200/406

* cited by examiner

*Primary Examiner* — Robert J Hoffberg
(74) *Attorney, Agent, or Firm* — Womble Carlyle Sandridge & Rice LLP

(57) ABSTRACT

An integrated switch assembly is described, the integrated switch assembly including at least an actuator and a flexible membrane mechanically coupled to the actuator, the flexible membrane formed of a resilient, electrically conductive material. In the described embodiment, the flexible membrane is held at a first electrical potential. The integrated switch assembly also includes at least an electrical contact at a second electrical potential connected to an electrical circuit. The integrated switch assembly is engaged when the actuator applies a mechanical force to the flexible membrane causing the flexible membrane to deflect to a point of contact with the electrical contact causing the electrical potential of the electrical contact to change from the second potential to the first potential. The electrical circuit detects the change in potential of the electrical contact as a signal.

10 Claims, 6 Drawing Sheets

INTEGRATED BUTTON ASSEMBLY

CROSS REFERENCE TO RELATED APPLICATIONS

This patent application takes priority under 35 U.S.C. 119 (e) of U.S. Provisional Patent Application having Ser. No. 61/319,790 entitled “INTEGRATED DOME SWITCH BUTTON” by Hobson et al. filed Mar. 31, 2010 that is incorporated by reference in its entirety for all purposes.

BACKGROUND

1. Field of the Invention

The invention relates to consumer products, and more particularly, methods and apparatus for providing a compact mechanical input device well suited for small form factor consumer electronic devices.

2. Description of the Related Art

Consumer products generally require mechanisms that assist a user in providing internal operational components instructions. Small form factor consumer electronic products, such as portable media players and the like, have small enclosures that leave little room for expansive mechanical inputs such as switches or buttons.

Therefore, a compact, rugged mechanical input for small form factor consumer electronic devices is desired.

SUMMARY

Broadly speaking, the embodiments disclosed herein describe a mechanical input assembly well suited for use in small form factor consumer electronic products.

An integrated switch assembly is described, the integrated switch assembly includes at least an actuator and a flexible membrane mechanically coupled to the actuator, the flexible membrane formed of a resilient, electrically conductive material. In the described embodiment, the flexible membrane is held at a first electrical potential. The integrated switch assembly also includes at least an electrical contact at a second electrical potential connected to an electrical circuit. The integrated switch assembly is engaged when the actuator applies a mechanical force to the flexible membrane causing the flexible membrane to deflect to a point of contact with the electrical contact causing the electrical potential of the electrical contact to change from the second potential to the first potential. The electrical circuit detects the change in potential of the electrical contact as a signal.

In one aspect, the first electrical potential is ground.

An integrated dome button is described. The integrated dome button includes at least a dome button formed of a flexible, resilient and electrically conductive material, a button feature, the button feature having a plunger that impinges on the dome button, and an electrically grounded base support plate arranged to electrically couple to and support the button feature. In the described embodiment, the base support plate includes an interior space having an anterior opening sized to accommodate the dome button wherein the dome button is electrically coupled to the base support plate at the anterior opening, and a lateral wall having an opening arranged to provide access to the interior space of the base support plate. The integrated dome button also includes an electrical contact aligned with a central portion of the dome button and the plunger such that when the plunger causes the dome button deflect, the dome button deflects to a point of contact with the electrical contact causing the electrical contact to connect to ground. The integrated dome button also includes a flexible connecter sized to fit within the opening in the lateral wall, the flexible connector electrically connecting the electrical contact with an external circuit.

A small form factor computing device is described. The small form factor computing device includes at least a housing arranged to enclose a plurality of operational circuits. The housing includes at least one opening, and an integrated switch assembly arranged to fit inside the at least one opening. In the described embodiment, the integrated switch assembly includes at least a button feature at least a portion of which is external to the housing, the button feature being accessible to a user of the small form factor computing device, an actuator integrally formed with the external feature, a flexible membrane mechanically coupled to the actuator, the flexible membrane being formed of a resilient, electrically conductive material, the flexible membrane being held at a first electrical potential, and an electrical contact connected to at least one of the plurality of operational circuits, the electrical contact being at a second electrical potential. The integrated switch assembly is engaged when the user applies a mechanical force to the external feature that is transferred to the actuator that, in turn, applies the mechanical force to the flexible membrane. The transferred force causing the flexible membrane to deflect to a point of contact with the electrical contact thereby changing the electrical potential of the electrical contact from the second potential to the first potential. The change in potential of the electrical contact is detected by the at least one operational circuit connected to the electrical contact as a signal.

A method of sending a signal to a circuit is described. The method is carried out by performing at least the following operations. Applying a mechanical force at an actuator, the actuator then transferring the applied mechanical force to a flexible membrane mechanically coupled to the actuator, the flexible membrane being formed of a resilient, electrically conductive material and is held at a first electrical potential. In response to the mechanical force applied to the flexible membrane, the flexible membrane deflects to a point of contact with an electrical contact electrically connected to the circuit. In response to the flexible membrane deflecting to the point of contact with the electrical contact, an electrical potential of the electrical contact is changed from a second potential to the first potential where the circuit interprets the change in potential as the signal.

Other aspects and advantages will become apparent from the following detailed description taken in conjunction with the accompanying drawings which illustrate, by way of example, the principles of the invention.

BRIEF DESCRIPTION OF THE DRAWINGS

The described embodiments will be readily understood by the following detailed description in conjunction with the accompanying drawings, wherein like reference numerals designate like structural elements, and in which.

DETAILED DESCRIPTION OF THE DESCRIBED EMBODIMENTS

In the following detailed description, numerous specific details are set forth to provide a thorough understanding of the concepts underlying the described embodiments. It will be apparent, however, to one skilled in the art that the described embodiments can be practiced without some or all of these specific details. In other instances, well known process steps have not been described in detail in order to avoid unnecessarily obscuring the underlying concepts.

Broadly speaking, the embodiments disclosed herein describe a mechanical input assembly well suited for use in small form factor consumer electronic products. In the described embodiments, the mechanical input assembly can take the form of a mechanical button assembly. The mechanical button assembly can include an exterior button feature, the exterior button feature having a plunger that impinges on a dome button formed of flexible and resilient material. The exterior button feature can be attached to and supported by an electrically grounded base support plate by way of at snaps each of which can be used to movably attach the exterior button feature to the base support plate. The base support plate can include an interior space associated with an anterior opening sized to accommodate the dome button. In the described embodiment, the dome button is electrically coupled to the base support plate. The base support plate can include an opening in a lateral wall of the base support plate that can provide access to the interior volume of the base support plate. A flexible connecter sized to fit within the opening in the lateral wall can include an electrical contact, the electrical contact being aligned with a central portion of the dome button such that when the dome button is depressed by the action of the plunger and makes contact with the electrical contact, the electrical contact is connected to ground thereby creating an electrical circuit.

Due in part to the design geometry, the mechanical input assembly promotes moisture and contamination isolation of the electrical elements. For example, the front face of the dome can be sealed with Kapton, and the flex can be sealed around the slot where it exits the base plate. Also, it is fairly straight forward to seal the hole in the housing with a face seal between the base plate and the housing.

These and other embodiments are discussed below with reference to FIGS. 1-6. However, those skilled in the art will readily appreciate that the detailed description given herein with respect to these figures is for explanatory purposes only and should not be construed as limiting.

Figures 1, 2A:
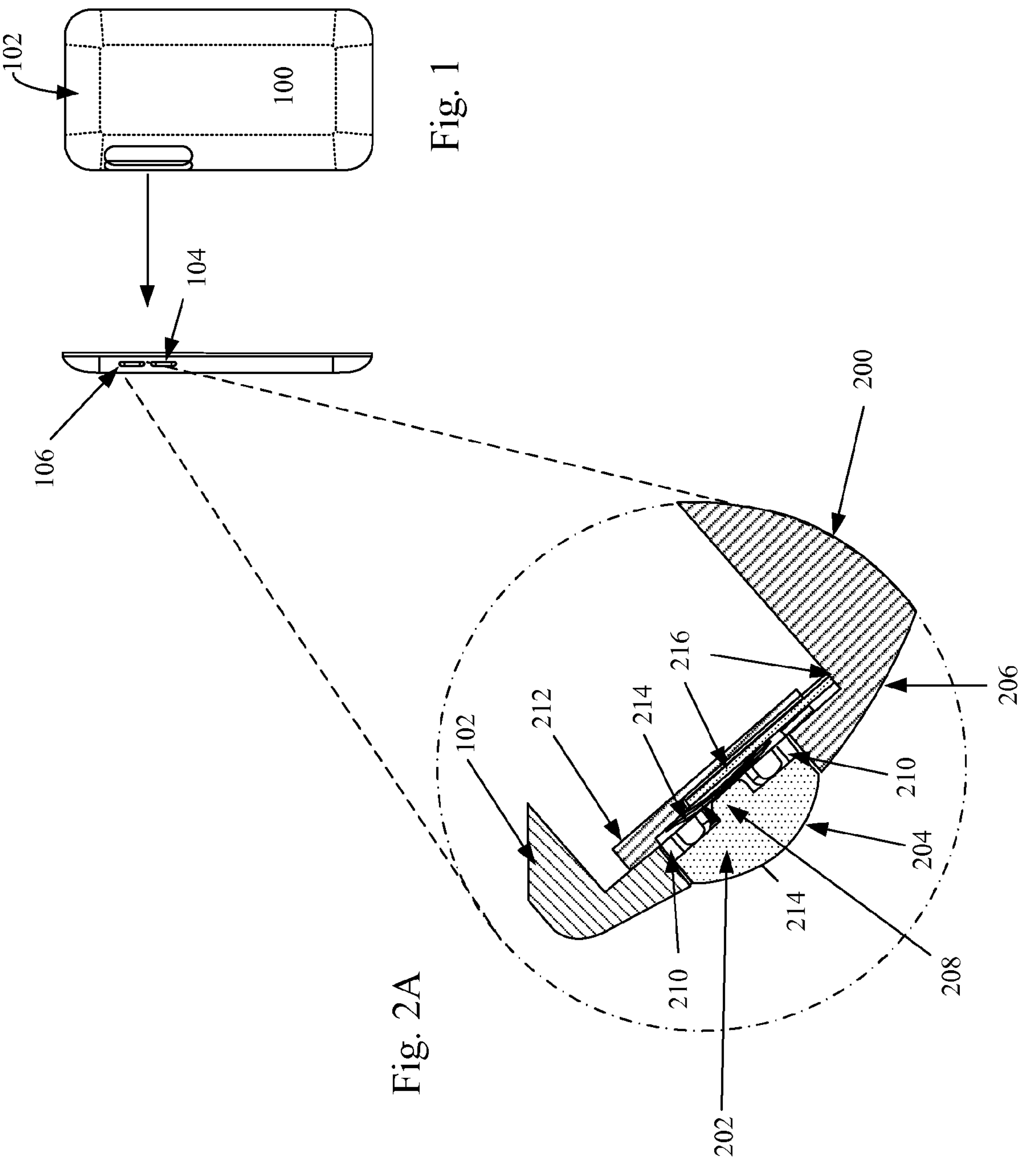
FIG. 1 shows a side view of representative small form factor consumer electronic product housing in accordance with the described embodiments.
FIGS. 2A-2B shows a view of assembled mechanical button assembly in accordance with the described embodiments.

FIG. 1 illustrates a specific embodiment of computing device 100. More specifically, FIG. 1 shows a bottom and side view of fully assembled computing device 100. Computing device 100 can process data and more particularly media data such as audio, video, images, etc. By way of example, computing device 100 can generally correspond to a device that can perform as a music player, game player, video player, personal digital assistant (PDA), tablet computer and/or the like. Although not limited to handheld devices, with regards to computing device 100 being handheld, computing device 100 can be held in one hand by a user while being operated by the user's other hand (i.e., no reference surface such as a desktop is needed). For example, the user can hold computing device 100 in one hand and operate computing device 100 with the other hand by, for example, operating a volume switch, a hold switch, or by providing inputs to a touch sensitive surface such as a display or pad.

Computing device 100 can include housing 102 that can be formed of any number of materials such as plastic or metal which can be forged, molded, or otherwise processed into a desired shape. The shape of housing 102 can conform to that of a hand in order to provide a more comfortable feel to a user and to offer a positive contribution to a user's overall experience with computing device 100. Housing 102 can be formed of any suitable material such as metal or plastic. Housing 102 can enclose and support internally various structural and electrical components (including integrated circuit chips and other circuitry) to provide computing operations for portable computing device. The integrated circuits can take the form of chips, chip sets, modules any of which can be surface mounted to a printed circuit board, or PCB, or other support structure. For example, a main logic board (MLB) can have integrated circuits mounted thereon that can include at least a microprocessor, semi-conductor (such as FLASH) memory, various support circuits and so on.

In order to maintain the overall look and feel of housing 102, openings 104 and 106 can be formed to accommodate a mechanical button or switch used to provide control signals to operational components installed within housing 102. The mechanical button or switch can power switches, volume control switches, user input devices and the like. For example, a power switch can be configured to turn the computing device 100 on and off, whereas a volume switch can be used to modify the volume level produced by computing device 100. Openings 104 and 106 can have a size and shape to conform to the overall shape of housing 102. Therefore, any mechanical input assembly used in the assembly of computing device 100 can also conform to both the shape and size of openings 104 and 106 and housing 102.

Figure 2B:
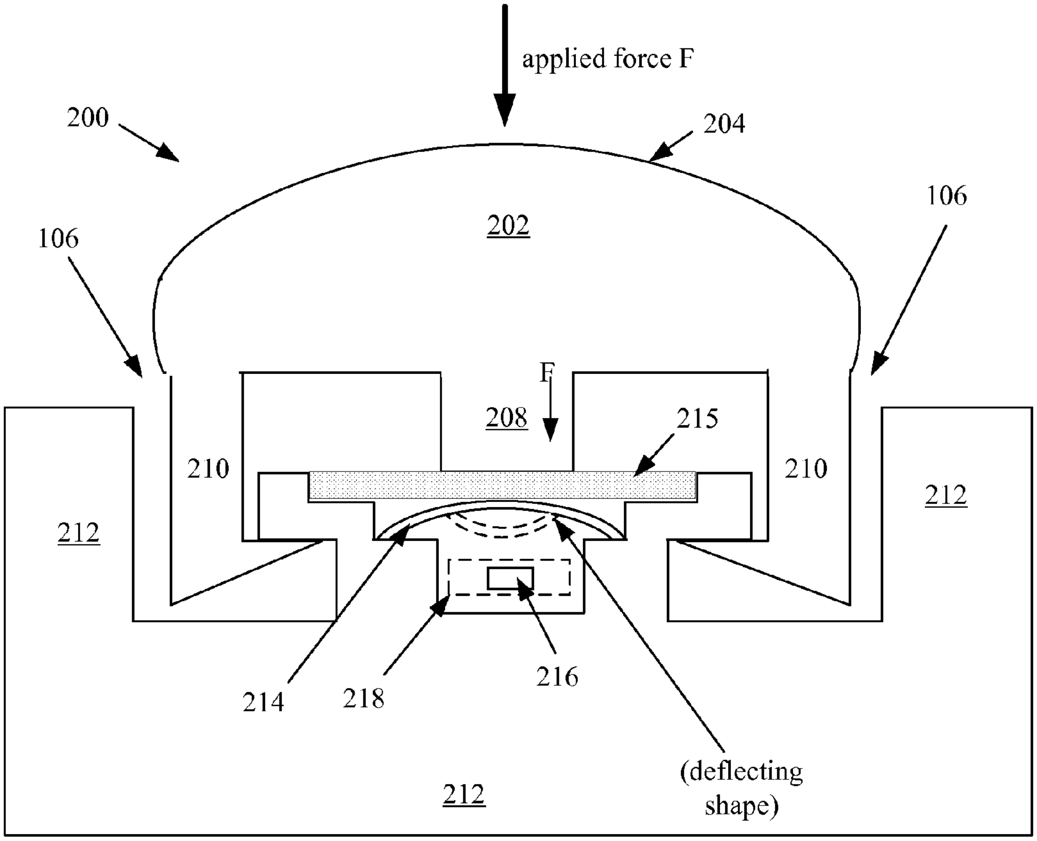
Figure 3:
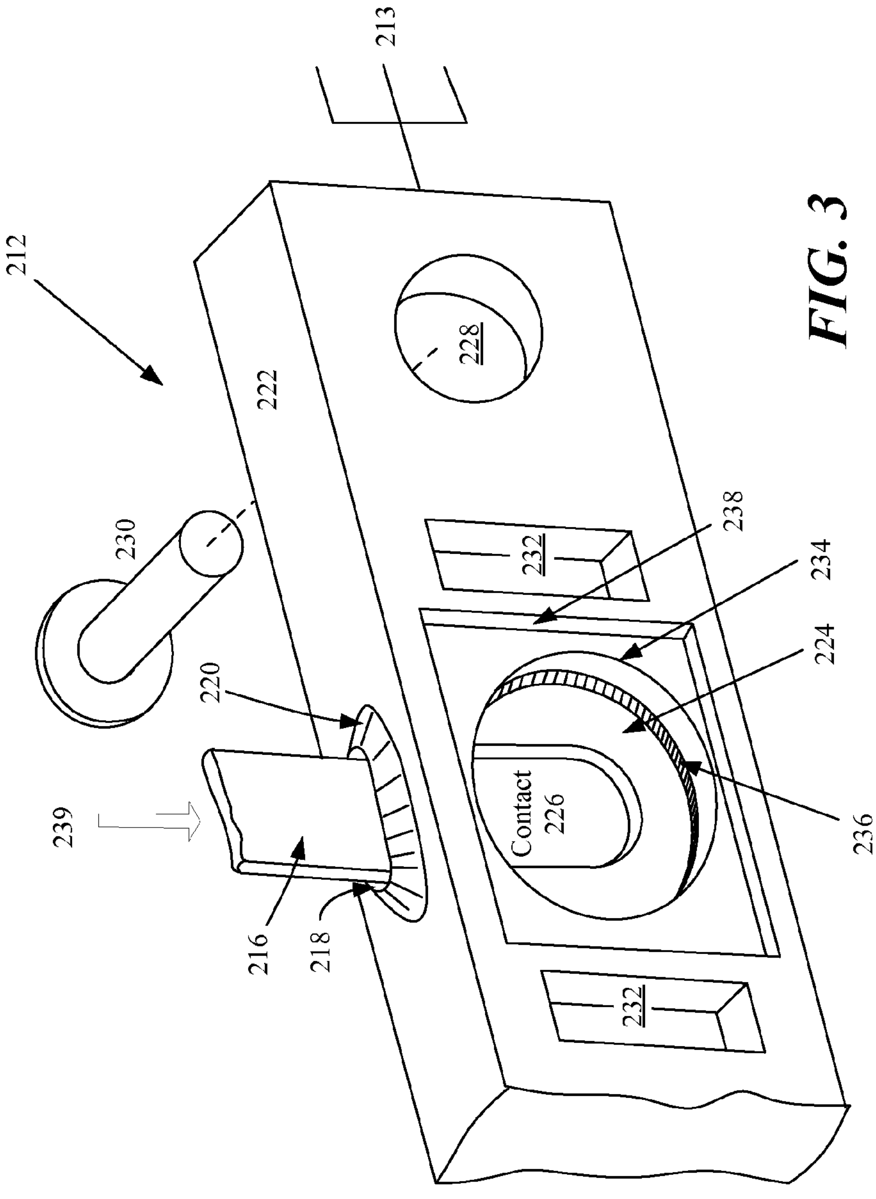
FIG. 3 shows a representative view of base support in accordance with the described embodiments.

Accordingly, FIGS. 2A and 2B shows a perspective side view and an isolated side view, respectively, of button assembly 200 in accordance with the described embodiments. As shown, button assembly 200 can be accommodated by either of openings 104 and 106. It should be noted that the choice of button technology affects the button's responses (i.e., the positive feedback that a button has been depressed) and travel (i.e., the distance needed to push the button to engage a switch). One of the most common button types is a "dome-button", which works as described below. When a button is depressed, the button pushes down on a flexible dome sitting beneath the external button portion. The flexible dome collapses, which gives tactile feedback to the user depressing the button as well as causing a conductive contact on the underside of the dome to touch a pair of conductive lines on the printed circuit board (PCB) below the dome, thereby closing the switch.

Button assembly 200 can be placed within either opening 104 or 106. Button assembly 200 can include exterior button feature 202 having exterior surface 204 that can, in some embodiments, extend above an exterior surface 206 of housing 102 and be shaped to accept a touch (also referred to as a press event) from a user's finger. Button feature 202 can be formed of material that can be electrically insulating and have an aesthetic look and feel appropriate for device 100. Although button feature 202 is typically formed of plastic or other related material, any appropriate material can be used without loss of generality. Button feature 202 can include plunger 208 that can be integrally formed with button feature 202 and be shaped to extend inwardly from an interior portion of button feature 202. Button feature 202 can also include attachment features that in the embodiment shown can take the form of snaps 210 used to attach button feature 202 to base support plate 212. In the described embodiment, base support plate 212 can be attached to an interior surface of housing 102 by way of, for example, attachment features such as screws or electrically conductive adhesives such as PSA as well as being soldered on or welded in place. In so doing, in addition to providing an electrical path between button assembly 200 and housing 102, base support plate 212 can provide structural support and stability for button assembly 200 especially when a user is pressing on button feature 202. Base support plate 212 is formed of an electrically conductive material such as stainless steel or other metals.

Referring to FIG. 2B, plunger 208 can be in contact with an upper portion of dome button 214 by way of protective layer 215 that can be formed of, for example, insulating material such as Kapton™. Dome button 214, however, can be formed of electrically conductive material and be connected with and supported by base support plate 212. In this way, both base support plate 212 and dome button 214 can be held at an electrical ground state when base support plate 212 is electrically connected to chassis ground formed by housing 102 or other suitable ground plane. Also shown in FIG. 3, flex connector 216 can be accommodated within opening 218 (shown in FIG. 3 with protective sealer 220 surrounding flex 216) within lateral wall 222 of base support plate 212. In the embodiment shown, base support plate 212 can include recess 224 used to accommodate electrical contact 226 located at a distal end of flex connector 216 aligned with dome button 214. Contact 226 can be located approximately in a central portion of recess 224 to be aligned with a central portion of dome button 214. Using this arrangement, dome button 214 can respond to pressure applied by plunger 208 by compressing inwardly in such as way that electrically grounded dome button 214 comes in direct and full conductive contact with electrical contact 226 within the recess 224. In this way, contact 226 can be electrically connected to ground by way of base support plate 212 through dome button 214 thereby completing a circuit associated with dome button 200 and flex 216.

Base support plate 212 can be formed of electrically conductive material such as metal along the lines of stainless steel. Base support plate 212 can include hole 228 used to accommodate fastener 230 used to attach base support plate 212 to housing 102. Since housing 102 provides chassis ground, base support plate 212 remains in an electrically grounded state. Holes 232 can be used to anchor snaps 210 to base support plate 212 thereby securing button feature 202 to housing 102. Dome button 214 can be accommodated by opening 234 having centrally located inner lip 236 that can be used to attach dome button 214 to base support plate 212 using any suitable electrically conductive adhesive. In addition to providing physical support to dome button 214, inner lip 236 can provide an electrically conductive path between dome button 214 and base support plate 212 thereby maintaining dome button 214 at ground. Region 238 can be formed on a surface of base support plate 212 facing dome button 214 having a size and shape to accommodate an insulator/sealer layer 215 formed of material along the lines of Kapton™. In this way, layer 215 can be used to provide a moisture barrier that can prevent water or other environmental contaminants from entering recess 224 or dome button 214.

Figure 4:
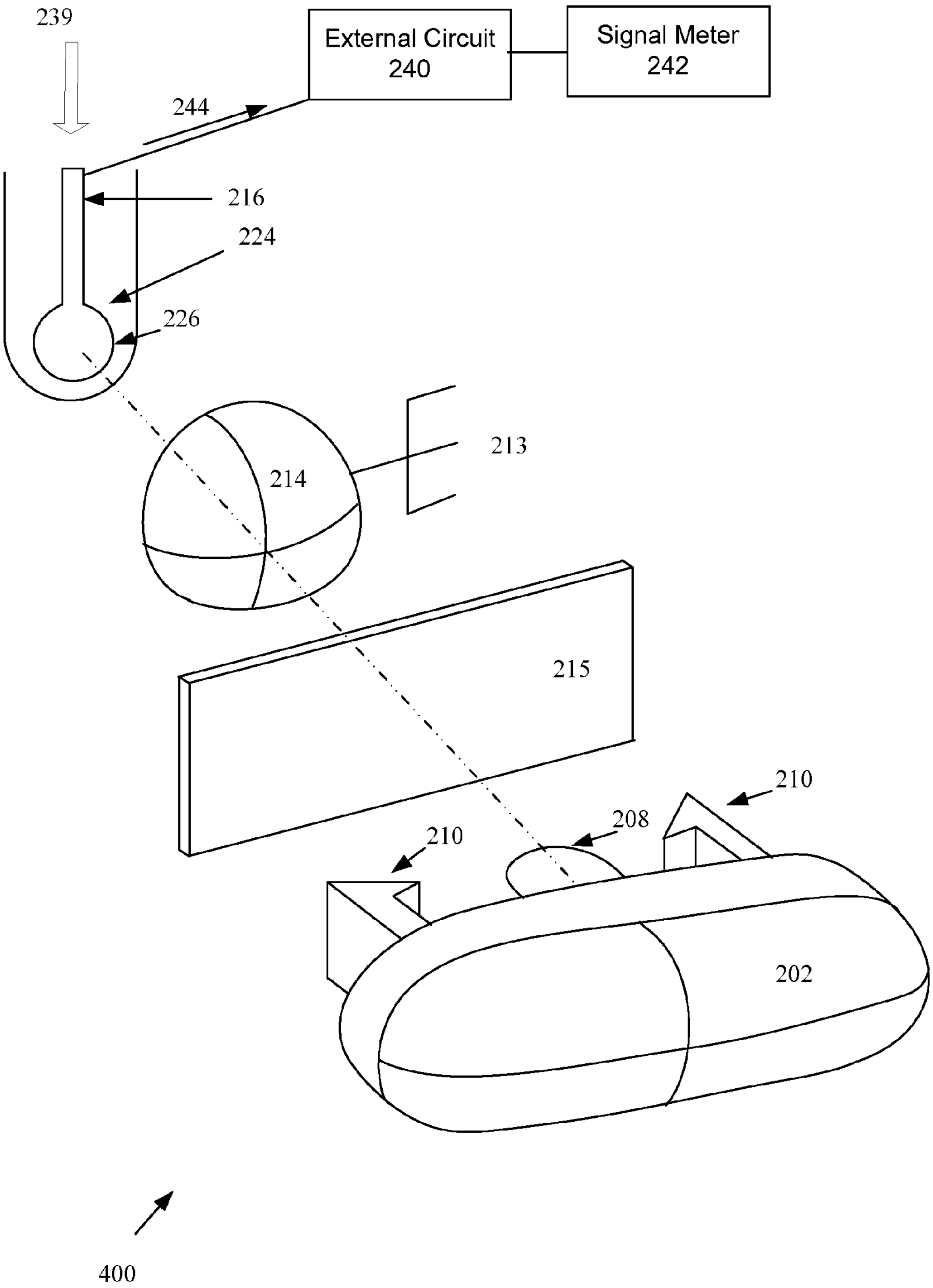
FIG. 4 show an exploded view of some of the components of mechanical button assembly in accordance with the described embodiments.

FIG. 4 shows an exploded view 400 of mechanical button assembly 200 in accordance with the described embodiments. In particular exploded view 400 provides an illustrative representation of a possible alignment of various components of button assembly 200, dome button 214, and flex connector 216. As discussed above, button assembly 200 can include button feature 202 having snaps 210 used to secure button assembly 200 to base support plate 212. Exploded view 400 also shows the juxtaposition of plunger 208 and protective layer 215 and dome button 214. By placing protective layer 215 formed of sealant/insulator material (such as Kapton™), protective layer 215 when placed between plunger 208 and dome button 214 can prevent contamination such as water from entering recess 224 or dome button 214 that can result in potential shorting. As further shown in F*ig*. 4, flex contact 226 can be centrally aligned ith dome button 214. When dome button 214 is fully compressed, an optimal electrical connection can be made between dome button 214 (held at ground by support plate 212) and contact 226, thereby altering electrical potential of flex connector 21 6 to first electrical potential 213. In this way, a good electrical ground connection can assure optimal response for those circuits coupled to flex connector 216 responsive to actuation by button assembly 200. By grounding flex connector 216 electrical potential of flex connector 216 can be changed from second electrical potential 239 to first electrical potential 213. Second electrical potential 239 can be established such that it is distinguishable from the first electrical potential 213. The electrical potential in flex connector 216 can be measured by external circuit 240, which is in electrical contact with flex connector 216. When the external signal 240 detects a change in electrical potential this acts as signal 244 prompting external circuit 240 to take an appropriate action based upon signal 244.

Figure 5:
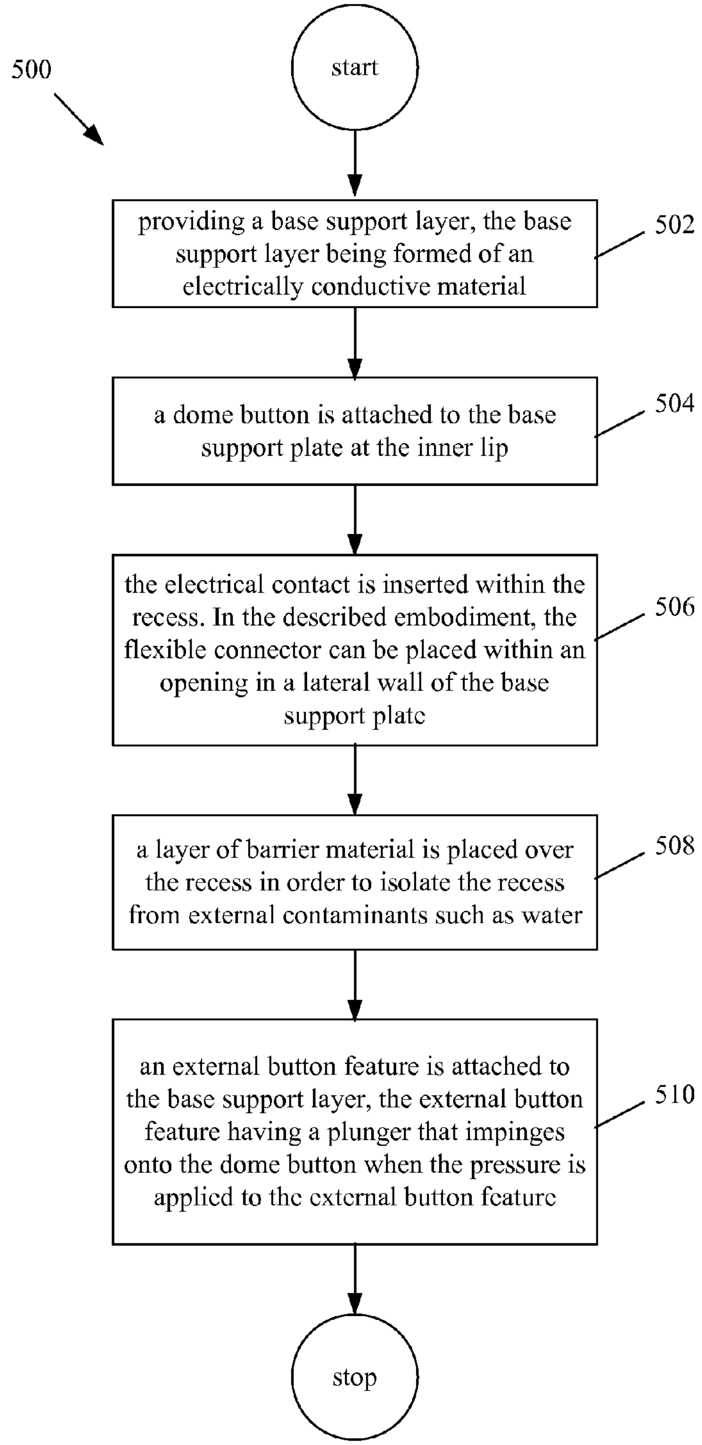
FIG. 5 shows a flowchart detailing a process in accordance with the described embodiments.

FIG. 5 shows a flowchart detailing process 500 in accordance with the described embodiments. Process 500 can begin at 502 by providing a base support layer, the base support layer being formed of an electrically conductive material such as stainless steel. The base support layer having a central portion having a recess having a size and shape sufficient to accommodate en electrical contact coupled with a flexible connector. The base support layer further having an inner lip formed around an upper edge of the central portion. Next at 504, a dome button is attached to the base support plate at the inner lip. In the described embodiment, the dome button is attached to the base support plate using an electrically conductive adhesive. In this way, the dome button is held at ground. Next at 506, the electrical contact is inserted within the recess. In the describe embodiment, the flexible connector can be placed within an opening in a lateral wall of the base support plate. Next at 508 a layer of barrier material is placed over the recess in order to isolate the recess from external contaminants such as water. Next at 510, an external button feature is attached to the base support layer, the external button feature having a plunger that impinges onto the dome button when pressure is applied to the external button feature. In this way, when sufficient pressure is applied, the dome button makes contact with the electrical contact. The electrical contact is then set to ground.

Figure 6:
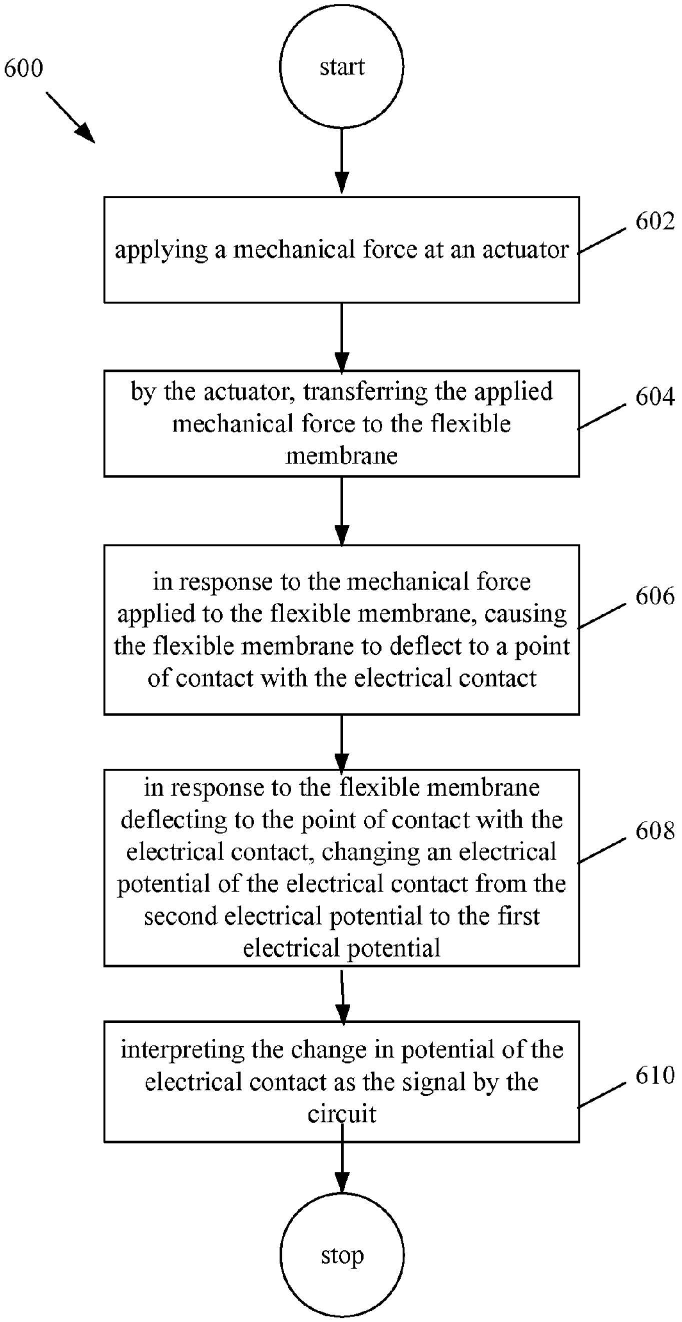
FIG. 6 shows a flowchart detailing a process sending a signal to a circuit in accordance with the described embodiments.

FIG. 6 shows flowchart detailing a method 600 of sending a signal to a circuit using an integrated button assembly in accordance with the described embodiments. The in integrated button assembly can include at least an actuator, a flexible membrane at a first electrical potential is mechanically coupled to the actuator, the flexible membrane being formed of a resilient, electrically conductive material, and an electrical contact connected to the circuit, the electrical contact being at a second electrical potential. The method can be carried by performing at least the following. First, at 602, a mechanical force is applied to the actuator and at 604; the actuator transfers the applied mechanical force to the flexible membrane. At 606, the mechanical force applied at the flexible membrane causes the flexible membrane to deflect to a point of contact with the electrical contact that changes an electrical potential of the electrical contact from the second potential to the first potential at 608. The circuit then interprets the change in potential of the electrical contact as the signal.

The many features and advantages of the present invention are apparent from the written description and, thus, it is intended by the appended claims to cover all such features and advantages of the invention. Further, since numerous modifications and changes will readily occur to those skilled in the art, the invention should not be limited to the exact construction and operation as illustrated and described. Hence, all suitable modifications and equivalents may be resorted to as falling within the scope of the invention.

What is claimed is:

1. An integrated dome button assembly, comprising:

an actuator;

a button feature integrally formed with the actuator, the actuator arranged to receive the mechanical force applied by the button feature;

a flexible membrane mechanically coupled to the actuator, the flexible membrane being formed of a resilient, electrically conductive material, wherein the flexible membrane is held at a first electrical potential; and an electrical contact connected to an electrical circuit, the electrical contact being at a second electrical potential, the second electrical potential being different from the first electrical potential, wherein the integrated dome button assembly is engaged when the actuator applies a mechanical force to the flexible membrane causing the flexible membrane to deflect to a point of contact with the electrical contact thereby changing the electrical potential of the electrical contact from the second electrical potential to the first electrical potential, wherein the change in potential of the electrical contact is detected by the electrical circuit as a signal and the electrical contact is connected to the electrical circuit by way of a flexible connector;

wherein the flexible membrane is a dome shaped membrane having an apex portion directly aligned with the actuator and a central portion of the electrical contact, and the flexible membrane is mechanically attached to, supported by and electrically coupled to an electrical conductive base support plate, wherein the electrically conductive base support plate is held at the first electrical potential and the base support plate maintains the flexible membrane at the first electrical potential.

2. The integrated dome button assembly as recited in claim 1, wherein the first electrical potential is ground.

3. A method of using an integrated dome button assembly to send a signal to an electrical circuit, comprising:

wherein the integrated dome button assembly comprises:

an actuator;

a button feature integrally formed with the actuator, the actuator arranged to receive the mechanical force applied by the button feature;

a flexible membrane mechanically coupled to the actuator, the flexible membrane being formed of a resilient, electrically conductive material, wherein the flexible membrane is held at a first electrical potential; and an electrical contact connected to the electrical circuit, the electrical contact being at a second electrical potential, the second electrical potential being different from the first electrical potential, the electrical contact is connected to the electrical circuit by way of a flexible connector, wherein the flexible membrane is a dome shaped membrane having an apex portion directly aligned with the actuator and a central portion of the electrical contact, and wherein the flexible membrane is mechanically attached to, supported by and electrically coupled to an electrical conductive base support plate, wherein the electrically conductive base support plate is held at the first electrical potential, the base support plate maintains the flexible membrane at the first electrical potential, applying a mechanical force at the actuator;

by the actuator, transferring the applied mechanical force to the flexible membrane;

in response to the mechanical force applied to the flexible membrane, causing the flexible membrane to deflect to a point of contact with the electrical contact;

in response to the flexible membrane deflecting to the point of contact with the electrical contact, changing an electrical potential of the electrical contact from the second electrical potential to the first electrical potential; and interpreting the change in potential of the electrical contact as the signal by the electrical circuit.

4. The method as recited in claim 3, wherein the first electrical potential is ground.

5. An integrated dome button, comprising:

a dome button formed of a flexible, resilient and electrically conductive material;

a button feature, the button feature having a plunger that impinges on the dome button formed of flexible and resilient material;

an electrically grounded base support plate arranged to electrically couple to and support the dome button, the base support plate comprising:

an interior space having an anterior opening sized to accommodate the dome button wherein the dome button is electrically coupled to the base support plate at the anterior opening, and a lateral wall having an opening arranged to provide access to the interior space of the base support plate;

an electrical contact aligned with a central portion of the dome button and the plunger such that when the plunger causes the dome button deflect, the dome button deflects to a point of contact with the electrical contact causing the electrical contact to connect to ground; and a flexible connecter sized to fit within the opening in the lateral wall, the flexible connector electrically connecting the electrical contact with an external circuit.

6. The integrated dome button as recited in claim 5, wherein the integrated dome button is incorporated into a housing, the housing forming a chassis ground.

7. The integrated dome button as recited in claim 6, wherein the housing encloses at least the external circuit.

8. The integrated dome button as recited in claim 5, further comprising: a protective layer disposed between the plunger and the dome button, the protective layer being formed of a flexible material, wherein the protective layer transfers a force applied by the plunger directly to the dome button.

9. A form factor computing device, comprising:

a housing, the housing arranged to enclose a plurality of operational circuits of the form factor computing device, wherein the housing includes at least one opening; and an integrated switch assembly arranged to fit inside the at least one opening, the integrated switch assembly comprising:

a button feature at least a portion of which is external to the housing, the button feature being accessible to a user of the form factor computing device, an actuator integrally formed with the button feature, a dome shaped flexible membrane mechanically coupled to the actuator, the dome shaped flexible membrane being formed of a resilient, electrically conductive material, wherein the dome shaped flexible membrane is held at a first electrical potential, the first electrical potential is ground;

an electrically grounded base support plate arranged to electrically couple to the dome shaped flexible membrane and support the button feature, the base support plate comprising:

an interior space having an anterior opening sized to accommodate the dome shaped flexible membrane wherein the dome shaped flexible membrane is electrically coupled to the base support plate at the anterior opening, and a lateral wall having an opening arranged to provide access to the interior space of the base support plate;

an electrical contact connected to at least one of the plurality of operational circuits, the electrical contact being at an electrical potential, the electrical potential being different from the ground, the electrical contact aligned with a central portion of the dome shaped flexible membrane and the actuator such that when the actuator causes the dome shaped flexible membrane to deflect, the dome shaped flexible membrane deflects to a point of contact with the electrical contact causing the electrical contact to connect to the ground, wherein the integrated switch assembly is engaged when the user applies a mechanical force to the button feature that transfers the mechanical force to the actuator that, in turn, applies the mechanical force to the flexible membrane causing the flexible membrane to deflect to a point of contact with the electrical contact thereby changing the electrical potential of the electrical contact from the second electrical potential to the ground, wherein the change in potential of the electrical contact is detected by at least one operational circuit of the plurality of operational circuits connected to the electrical contact as a signal; and a flexible connecter sized to fit within the opening in the lateral wall, the flexible connector electrically connecting the electrical contact with the at least one operational circuit.

10. The form factor computing device as recited in claim 9, wherein the form factor computing device is a portable media player.

* * * * *